United States Patent
Shen et al.

(10) Patent No.: US 8,128,183 B2
(45) Date of Patent: Mar. 6, 2012

(54) RACK SYSTEM

(75) Inventors: Wyat Shen, Shanghai (CN); James Weir, Calgary (CA); Zia Shariff, Toronto (CA); Leonard Selinger, Calgary (CA); Don Rudkin, Calgary (CA); Brett Anthony Kostka, Airdrie (CA); Peter Dong, Sheyang (CN); Jeffrey Zhao, Suzhou (CN); Nick Wang, Tai Cang (CN)

(73) Assignee: Sanmina SCI-Corporation, San Jose, CA (US)

( * ) Notice: Subject to any disclaimer, the term of this patent is extended or adjusted under 35 U.S.C. 154(b) by 182 days.

(21) Appl. No.: 12/505,002

(22) Filed: Jul. 17, 2009

(65) Prior Publication Data

US 2011/0012489 A1    Jan. 20, 2011

(51) Int. Cl.
*A47G 29/00* (2006.01)
*A47G 81/00* (2006.01)

(52) U.S. Cl. .................. 312/265.4; 312/223.1

(58) Field of Classification Search .... 312/265.1–265.4, 312/223.1, 296; 211/26; 174/36–371
See application file for complete search history.

(56) References Cited

U.S. PATENT DOCUMENTS

| | | | | |
|---|---|---|---|---|
| 3,647,274 A | * | 3/1972 | Schnelle | 312/265.4 |
| 5,256,833 A | * | 10/1993 | Schwenk | 174/369 |
| 5,550,713 A | * | 8/1996 | Pressler et al. | 361/818 |
| 6,712,434 B2 | * | 3/2004 | Knab et al. | 312/265.4 |
| 6,902,068 B1 | * | 6/2005 | Fontana et al. | 211/26 |
| 2005/0127802 A1 | * | 6/2005 | Chen | 312/265.4 |
| 2005/0174020 A1 | * | 8/2005 | Francisquini | 312/265.3 |
| 2007/0052333 A1 | * | 3/2007 | Freire | 312/265.4 |

* cited by examiner

*Primary Examiner* — Darnell Jayne
*Assistant Examiner* — Andrew Roersma
(74) *Attorney, Agent, or Firm* — Julio M. Loza; Loza & Loza, LLP

(57) ABSTRACT

A rack system for housing electronic and/or electrical equipment is provided comprising a rectangular base frame, a rectangular top frame, and four elongated vertical support members each extending along a longitudinal axis between and joined to two associated corners of the rectangular base frame and the rectangular top frame. The rectangular base frame, rectangular top frame, and the four elongated vertical support members may be constructed from members having the same substantially A-frame cross-section. Each support member may be constructed from an elongated sheet material extending along a longitudinal axis by bending the sheet material about an axis parallel to the longitudinal axis of the sheet material to form at least three elongated sections, where a first section and a second section are adjacent and substantially perpendicular to each other and a third section extends between approximately mid-point of the first section and approximately mid-point of the second section.

23 Claims, 19 Drawing Sheets

RACK SYSTEM

RELATED PATENTS

The present application for patent is related to Patent Cooperation Treaty application PCT/US2004017351, filed on Jun. 1, 2004, and is also related to U.S. Provisional Application 60/474,561, file May 30, 2003, both of which are incorporated herein by reference.

FIELD

At least one feature relates to a rack for housing for electronic and/or electrical equipment, and, more particularly, to racks having high stiffness and strength.

BACKGROUND

A common use of equipment racks is for housing electronic or electrical equipment in the racks. In general, the rack has a box-like shape, including a base, side members extending upwardly from the base, and a top mounted to the top ends of the side members. The base, top, and side members form an enclosure within which the electronic or electrical equipment is disposed. A rack serves to preserve electronic or electrical equipment from damage in an operating environment or due to environmental conditions (e.g., falling rubble, water, transportation, vibrations, earthquake, etc.). While it is possible to make a sturdy equipment rack to protect the equipment by using heavier material and more bracing members, this adds significantly to its cost. Heavier material and more bracing, therefore, are not a solution acceptable in the competitive environment of modern rack systems. In addition, it has been found that lighter weight, yet more rigid equipment racks behave more favorably under certain environmental conditions or events (e.g. earthquakes or other situations).

Therefore, a rack is needed that protects the equipment housed therein yet What is desired is a new and improved electronic and/or electrical equipment rack system having high stiffness and strength with low cost. Preferably, the improved rack will include increased structural rigidity without a substantial increase in weight.

SUMMARY

A rack system is provided for housing electronic and/or electrical equipment. The rack system may include a rectangular base frame, a rectangular top frame and four vertical supports. The rectangular base frame may have four horizontal support members each extending along a longitudinal axis. The rectangular top frame may have four horizontal support members each extending along a longitudinal axis. The four elongated vertical support members each extending along a longitudinal axis between and joined to two associated corners of the rectangular base frame and the rectangular top frame. The horizontal support members of the rectangular base frame and the rectangular top frame and the vertical support members may have the same substantially A-frame cross-section. Each support member is made from an elongated sheet material extending along a longitudinal axis by bending the sheet material about an axis parallel to the longitudinal axis of the sheet material to form at least three elongated sections.

In one example, the A-frame cross-section may include a first section and a second section adjacent and substantially perpendicular to each other and a third section extends between approximately mid-point of the first section and approximately mid-point of the second section. Each of the horizontal support members of the rectangular base frame and the rectangular top frame and the vertical support members may include a plurality of openings extending longitudinally along each support member. The plurality of openings may be located longitudinally along the first section and the second section of each support member. The plurality of openings may serve as attachment points for exterior panel mounted to the rack system. The third section may be defined by a center segment on a first plane and two co-planar adjacent segments on a second plane, where the first and second planes are parallel planes.

In one embodiment, the rack system may also include a plurality of corner blocks located at each corner where two horizontal support members and a vertical support member meet. The corner blocks may have a cross section substantially the same as an interior shape defined by the first section, the second section, and the third section of a support member. Each corner block may be welded to two horizontal members along right-angle sides of the corner block and welded to a vertical support member on a third side. Each corner block may include at least one opening extending longitudinally and adapted to receive a leveling foot or a lifting fastener for the rack system.

In one embodiment, the rack system may also include a plurality of panels mounted to surface planes of the rack system. The plurality of panels may include a top panel attached to the top frame, wherein the top panel includes retainers extending outwardly from a first edge of the top panel, and a first horizontal support member which is associated with the first edge includes a plurality of openings extending longitudinally along the first horizontal support member to engage the retainers. A second edge of the top panel opposite to the first edge includes retainers for engaging a plurality of openings extending longitudinally along a second horizontal support member which is associated with the second edge.

In one embodiment, the rack system may also include a plurality of panels mounted to surface planes of the rack system. The plurality of panels may include retainers having tabs extending outwardly from the edges of the panels, and the vertical and horizontal support members define slots facing the tabs for receiving the tabs of the panels.

In one embodiment, the rack system may also include one or more doors mounted to surface planes of the rack system, each door including at least one hinge on a first edge and a locking mechanism on an opposite second edge. The doors may be reversible so that they can be mounted in either a right-handed or left-handed orientation by attaching the at least one hinge to one of the vertical support members.

In one embodiment, the rack system may also include a plurality of doors hingedly coupled on up to five sides of the rack system. The plurality of doors may include electromagnetic compatibility (EMC) gaskets and all support members may be made from aluminum-Zinc (Al—Zn) sheet metal.

According to another feature, the rack system may also include a plurality of wheel supports coupled to the corners of the rectangular base frame.

According to another feature, the rack system may also include a plurality of internal horizontal members extending between two vertical support members along one surface plane of the rack system to enhance the strength of the rack system.

In one implementation, the rack system may be adapted to couple to one or more other rack systems on up to all six sides of the rack system.

BRIEF DESCRIPTION OF THE DRAWINGS

The features, nature, and advantages of the present aspects may become more apparent from the detailed description set forth below when taken in conjunction with the drawings in which like reference characters identify correspondingly throughout.

DETAILED DESCRIPTION

One novel feature provides a new and improved electronic equipment rack system including features that provide the rack with exceptional strength and rigidity without substantially increasing the weight and cost of the rack.

Figure 1:
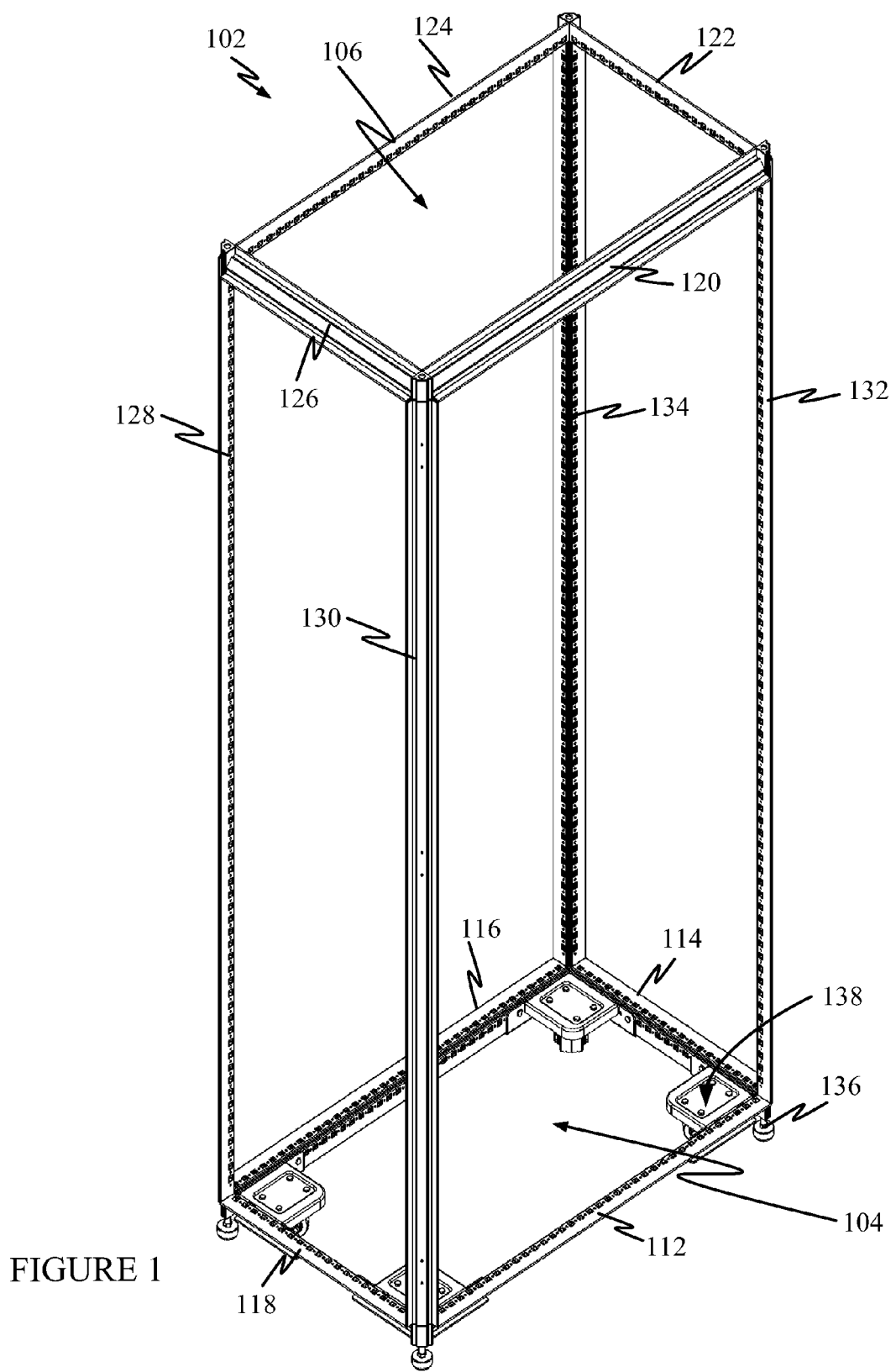
FIG. 1 illustrates one example of a frame structure for a rack system that may be used to house electronic and/or electrical equipment.

FIG. 1 illustrates one example of a frame structure 102 for a rack system that may be used to house electronic and/or electrical equipment. The frame structure 102 may include a rectangular base frame 104, having four horizontal support members 112, 114, 116, and 118, a rectangular top frame 106, having four horizontal support members 120, 122, 124, and 126, and a plurality of elongated vertical support members 128, 130, 132, and 134 extending between the rectangular base frame 104 and the rectangular top frame 106. That is, the vertical support members 128, 130, 132, and 134 may couple to a different corner of the rectangular base frame 104 and the rectangular top frame 106. The horizontal and vertical support members of the frame structure 102 may be constructed from a single type of structural member such that the profiles of the vertical and horizontal support members are identical. To achieve high stiffness and strength with low weight, the horizontal and vertical support members may be welded together at their joint points. The rectangular base frame 106 may permit attaching wheel supports 138 along its four corners, thereby avoiding the need for a bottom cover panel and allowing more area flow at the bottom of the rack system. Additionally, some embodiments may also allow coupling of leveling feet 136 along the four corners.

In one embodiment, the rack system may be approximately two (2) meters high, sixty (60) centimeters wide, by one (1) meter deep. However, the height, width, and/or depth of the frame 102 can be easily changed within wide range (e.g., 100 millimeters ~2400 millimeters).

Note that the term "rack" includes various types of enclosures, industrial enclosures, and/or cabinets used for housing electronic and/or electrical equipment.

Figure 2:
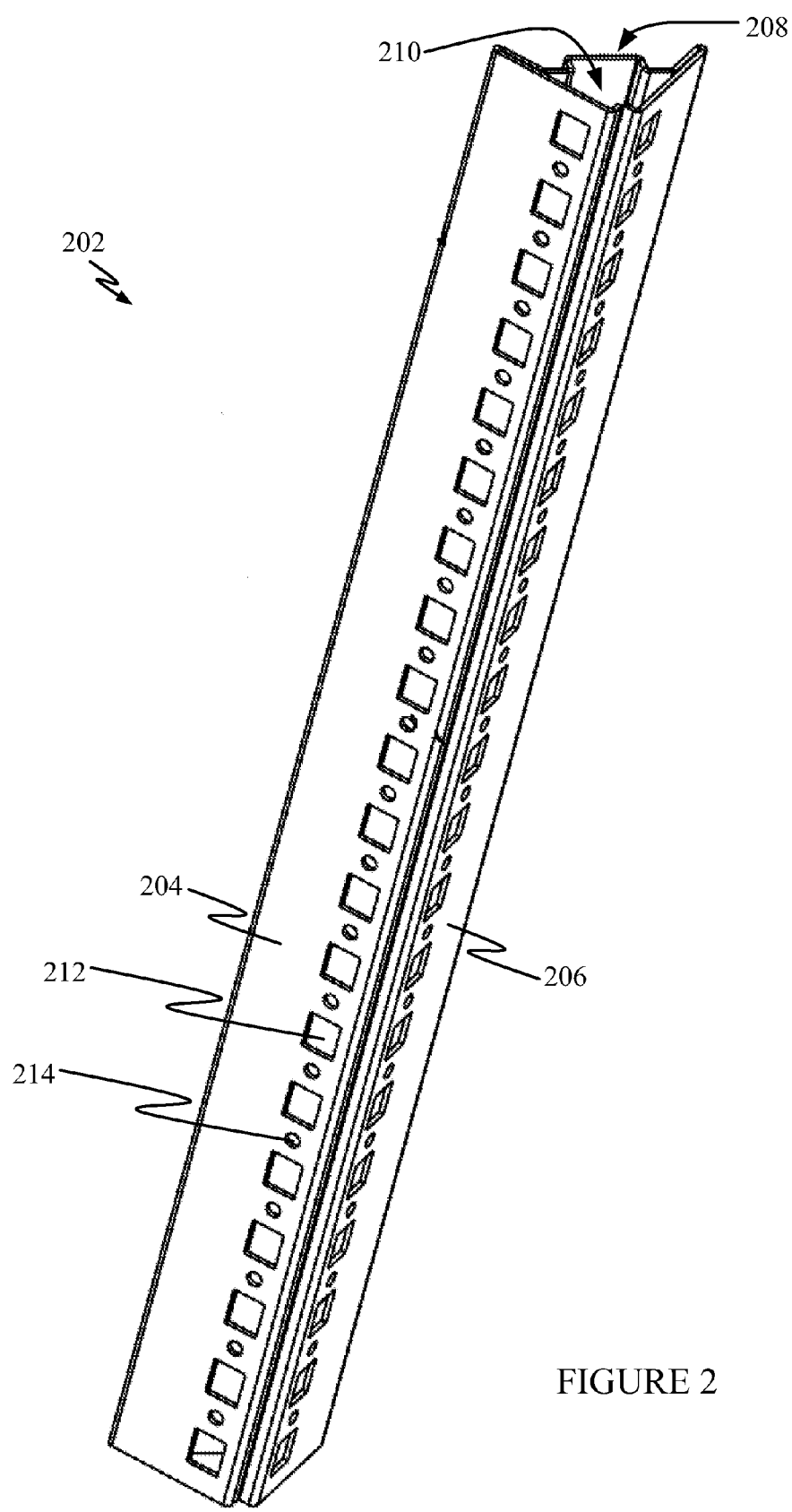
FIG. 2 illustrates a first perspective view of the structural member having generally an A-frame comprising a first side and a second side at approximately right angles to each other, and a third side extending from approximately a midpoint of the first side to approximately a midpoint of the second side along a longitudinal direction.
Figure 3:
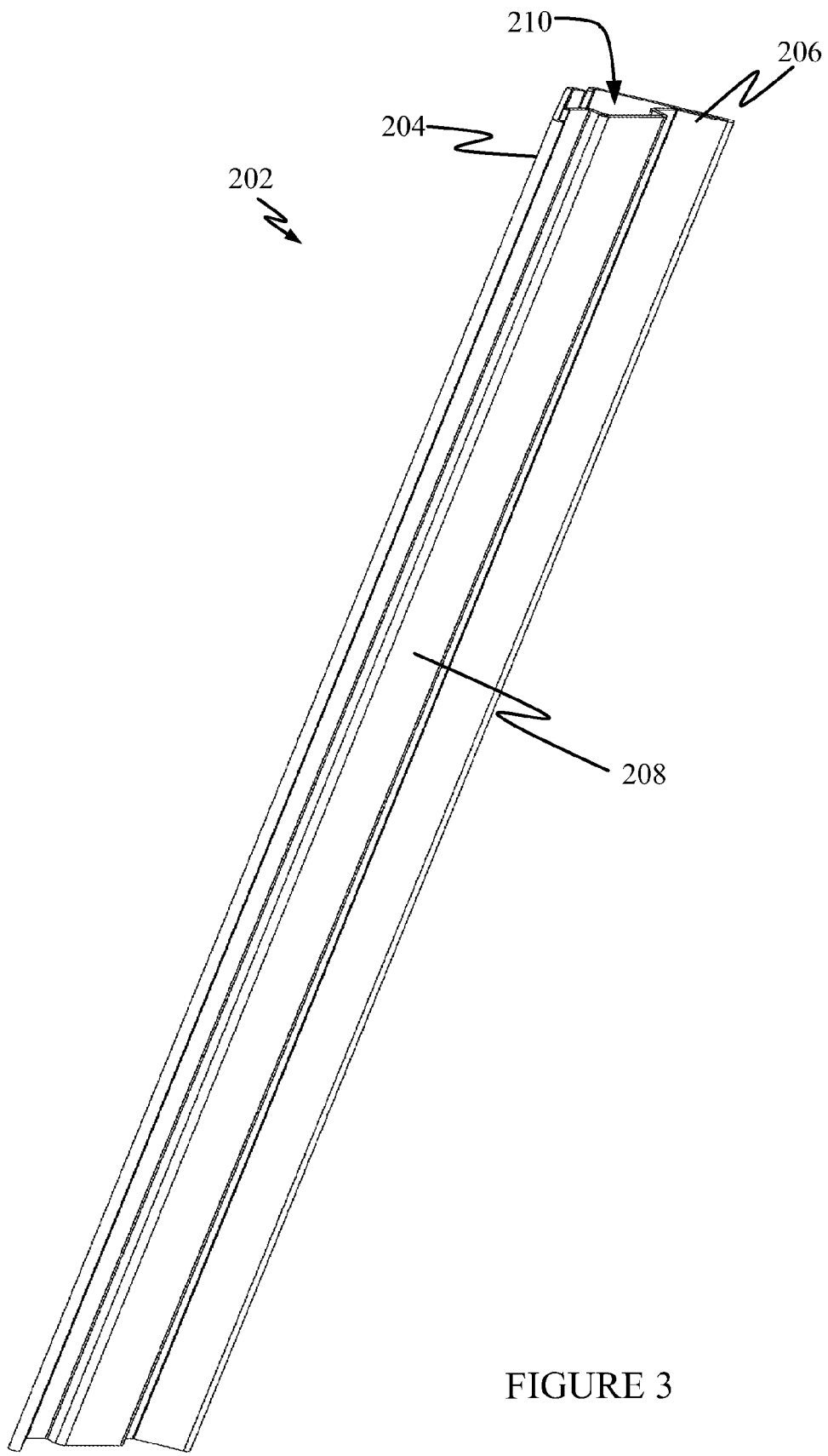
FIG. 3 illustrates a second perspective view of the structural member of FIG. 2.
Figure 4:
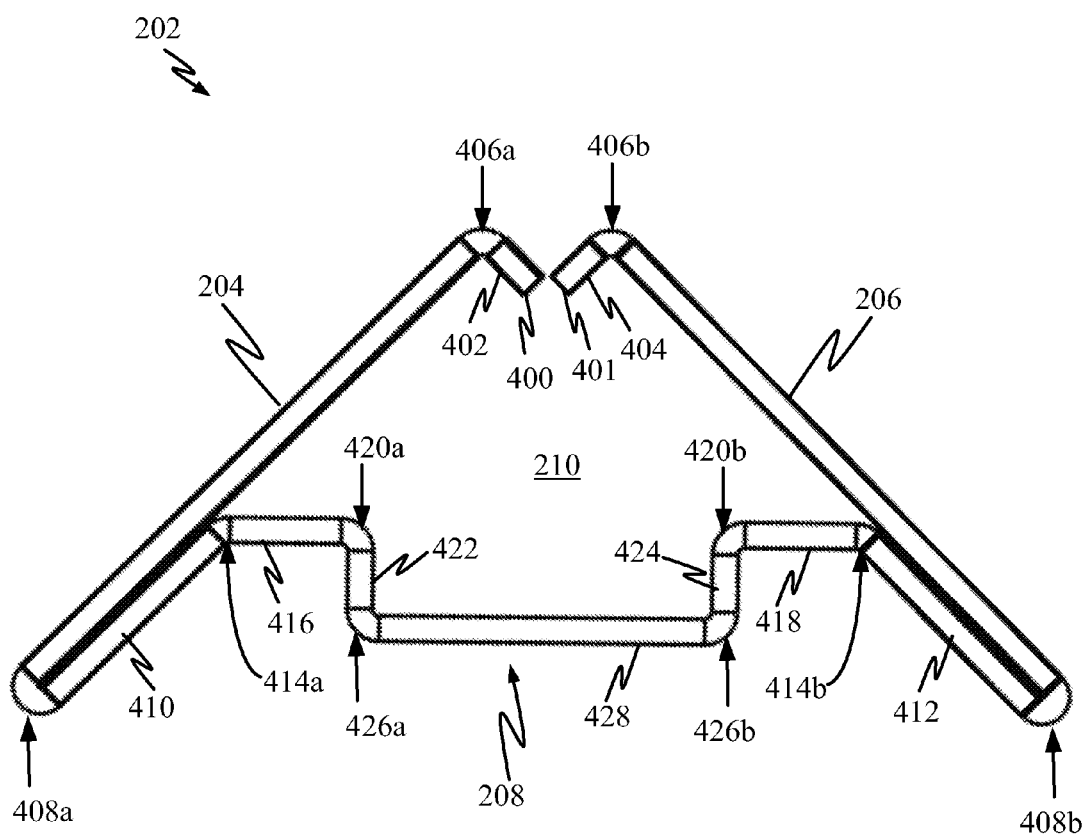
FIG. 4 illustrates a cross-sectional view of the structural member of FIGS. 2 and 3.

FIGS. 2-4 illustrate an example of a structural member 202 that may be utilized as the horizontal and vertical support members in FIG. 1. By using the same structural member 202 for all support members of the frame structure 102, it facilitates interchangeability among some of the support members.

FIG. 2 illustrates a first perspective view of the structural member 202 having generally an A-frame comprising a first side 204 and a second side 206 at approximately right angles to each other, and a third side 208 extending from approximately a midpoint of the first side 204 to approximately a midpoint of the second side 206 along a longitudinal direction. The first side, second side, and third side define an opening or cavity 210 along the length of the structural member 202. The first side 204 and/or second side 206 may also include a first plurality of square or rectangular openings 212 along the length of the structural member 202. In this example, the first plurality of square or rectangular openings 212 may be located adjacent an edge between the first side 204 and second side 206. The first side 204 and/or second side 206 may also include a second plurality of circular openings 214 along the length of the structural member 202. In this example, the first plurality of circular openings 214 may be located adjacent an edge between the first side 204 and second side 206. The first plurality of square or rectangular openings 212 may be alternated with the second plurality of circular openings 214.

The first and second plurality of openings 212 and 214 may serve to couple external panels or doors around the outside of the frame structure 102 and/or interior support members for supporting equipment inside the rack system. In one example, the first and/or second plurality of openings 212 and 214 may define a pattern to meet the Electronic Industries Association (EIA) 310-E Standard for the 25 millimeter (mm) pitch.

FIG. 3 illustrates a second perspective view of the structural member 202 of FIG. 2.

FIG. 4 illustrates a cross-sectional view of the structural member 202 of FIGS. 2 and 3. In one example, the structural member 202 may be manufactured by folding a single sheet of metal, thereby reducing time and/or costs associated with forming such structural member from separated pieces and welding the pieces together.

The structural member 202 (e.g., horizontal support member 112, 114, 122, 124 of the rectangular base frame and the rectangular top frame and the vertical support members 128, 130, 132, 134) may be defined by a first section (first side 204) and a second section (second side 206) adjacent and substantially perpendicular to each other and a third section (third side 208) extending between approximately a mid-point of the first section and approximately a mid-point of the second section. The third section (third side 208) may be defined by a center segment 428 on a first plane and two co-planar adjacent segments 416 and 418 on a second plane, where the first and second planes are parallel planes. The structural member 202 may be made from an elongated sheet material extending along a longitudinal axis by bending the sheet material about an axis parallel to the longitudinal axis of the sheet material to form at least three elongated sections (e.g., first section 204, second section 206, and third section 208).

In this example, it can be appreciated that the single sheet of metal may be folded into a substantially A-frame profile. The single sheet of metal may have a first edge 400 and an opposite second edge 401. In one example, the structural member 202 may be formed by folding a first segment 402 at a first point 406a such that the first segment 402 is at substantially a right angle to the first side 204. Similarly, a second segment 404 is folded at a second point 406b such that the second segment is at substantially a right angle to the second side 206. A third segment 410 is formed by making a substantially full fold at a third point 408a at an opposite end of the first side 204. Similarly, a fourth segment 412 is formed by making a substantially full fold at a fourth point 408b at an opposite end of the second side 206. Another fold is made at fifth fold point 414a to form a fifth segment 416. Similarly, a sixth segment 418 is formed by folding the fourth segment at a sixth fold point 414b. The fold points 414a and 414b may be, for example, forty-five degree folds. A seventh segment 422 may be formed by making a right-angle fold at fold point 420a. Likewise, an eighth segment 424 may be formed by making a right-angle fold at fold point 420b. A ninth segment 428 is then formed by folding the seventh segment 422 and eight segment 424 at folding points 426a and 426b, respectively. In one example, the support member 202 may be symmetrical such that the first side 204 and second side 206 have the same dimensions.

Note that the segments of the structural member 202 may be formed in different ways by folding the single sheet of metal in various different sequences. For example, a single metal sheet may be folded starting by forming the ninth segment 428, then the seventh and eighth segments 422 and 424, then the fifth and sixth segments 416 and 418, then the first and second segments 402 and 404, and finally the third and fourth segments 410 and 412. Other sequences for folding a single sheet of metal and forming the various segments of the structural member 202 are contemplated within the scope of the invention. By forming the structural member 202 in this manner, welding and/or other fastening means are avoided in forming the structural member 202.

The shape of the structural member 202 allows coupling and fitting of the vertical and horizontal support members of the frame structure 102 at the corners of the frame structure.

Figure 5:
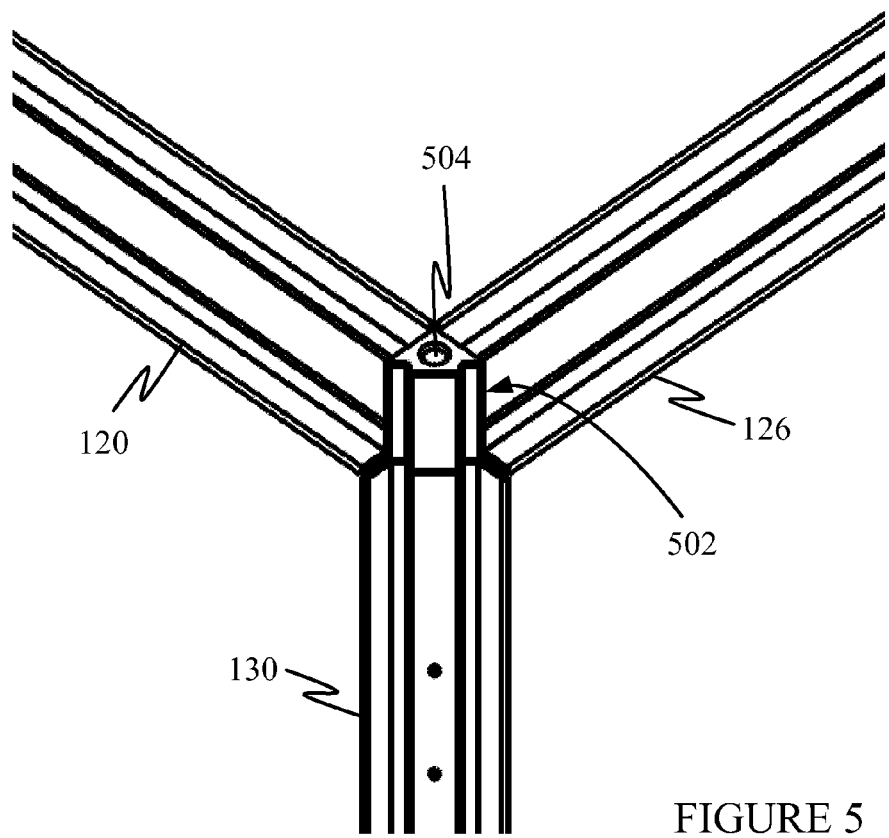
FIG. 5 illustrates a first view of a corner joint of the structural frame where a first horizontal support member joins with a second horizontal support member and a vertical support member.

FIG. 5 illustrates a first view of a corner joint 502 of the structural frame 102 where a first horizontal support member 120 joins with a second horizontal support member 126 and a vertical support member 130. The corner joint 502 may couple the three support members by welding, for example. The first view illustrated in FIG. 5 is an exterior view. A corner block 504 may be utilized to keep the three support members 120, 126, and 130 at right angles to each other.

Figure 6:
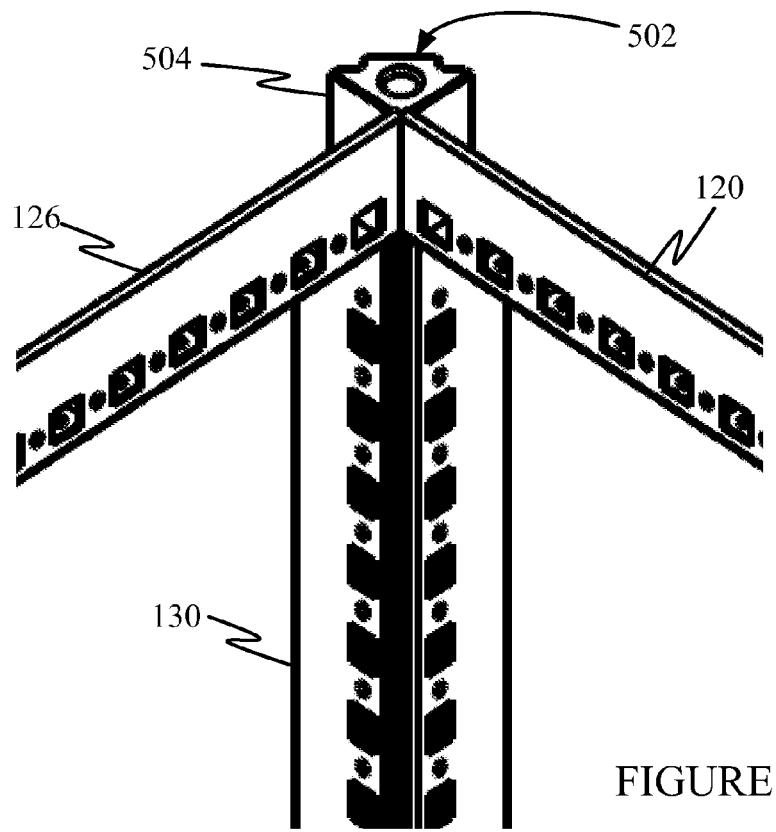
FIG. 6 illustrates a second view of the corner joint of the structure frame. The second view of the corner joint is opposite the first view of FIG. 5.

FIG. 6 illustrates a second view of the corner joint 502 of the structure frame 102. The second view of the corner joint 502 is opposite the first view of FIG. 5. The second view illustrated in FIG. 6 is an interior view.

Figure 7:
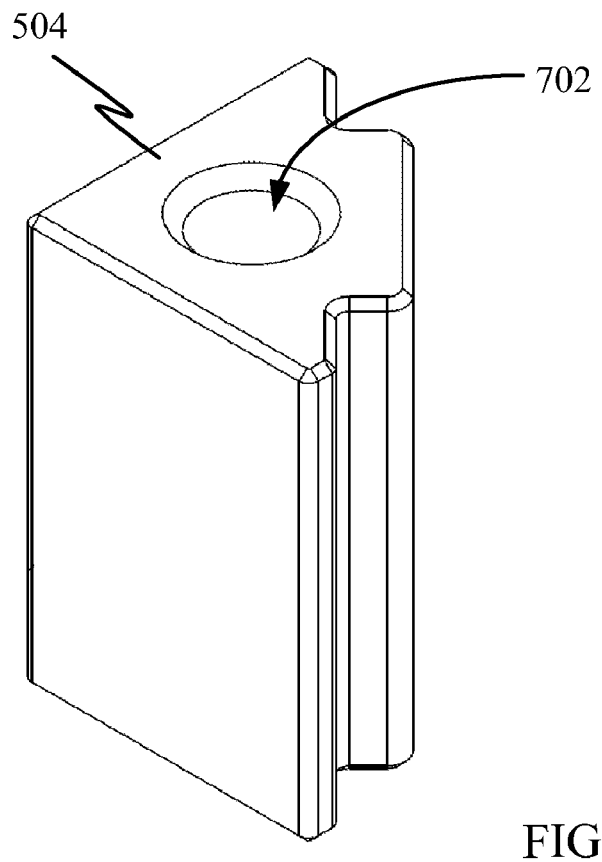
FIGS. 7 and 8 illustrate an example of the corner block illustrated in FIG. 5.
Figure 8:
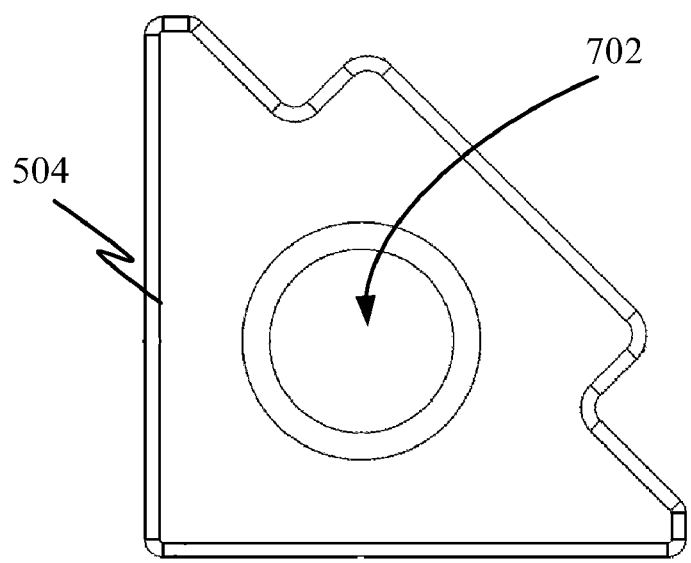

FIGS. 7 and 8 illustrate an example of the corner block 504 of FIG. 5. In one example, the corner block 504 may include an opening 702 extending longitudinally through the block 504. In some implementations, the opening 702 may be used to receive a pin for the leveling feet 136 (FIG. 1). Additionally, the opening 702 may be used couple a lifting fastener (e.g., eye bolts 1504 in FIG. 15) that may serve as lifting points for the rack system.

In one example, the corner block 504 may have across section substantially the same as an interior shape defined by the first section, the second section, and the third section of a support member.

Figure 9:
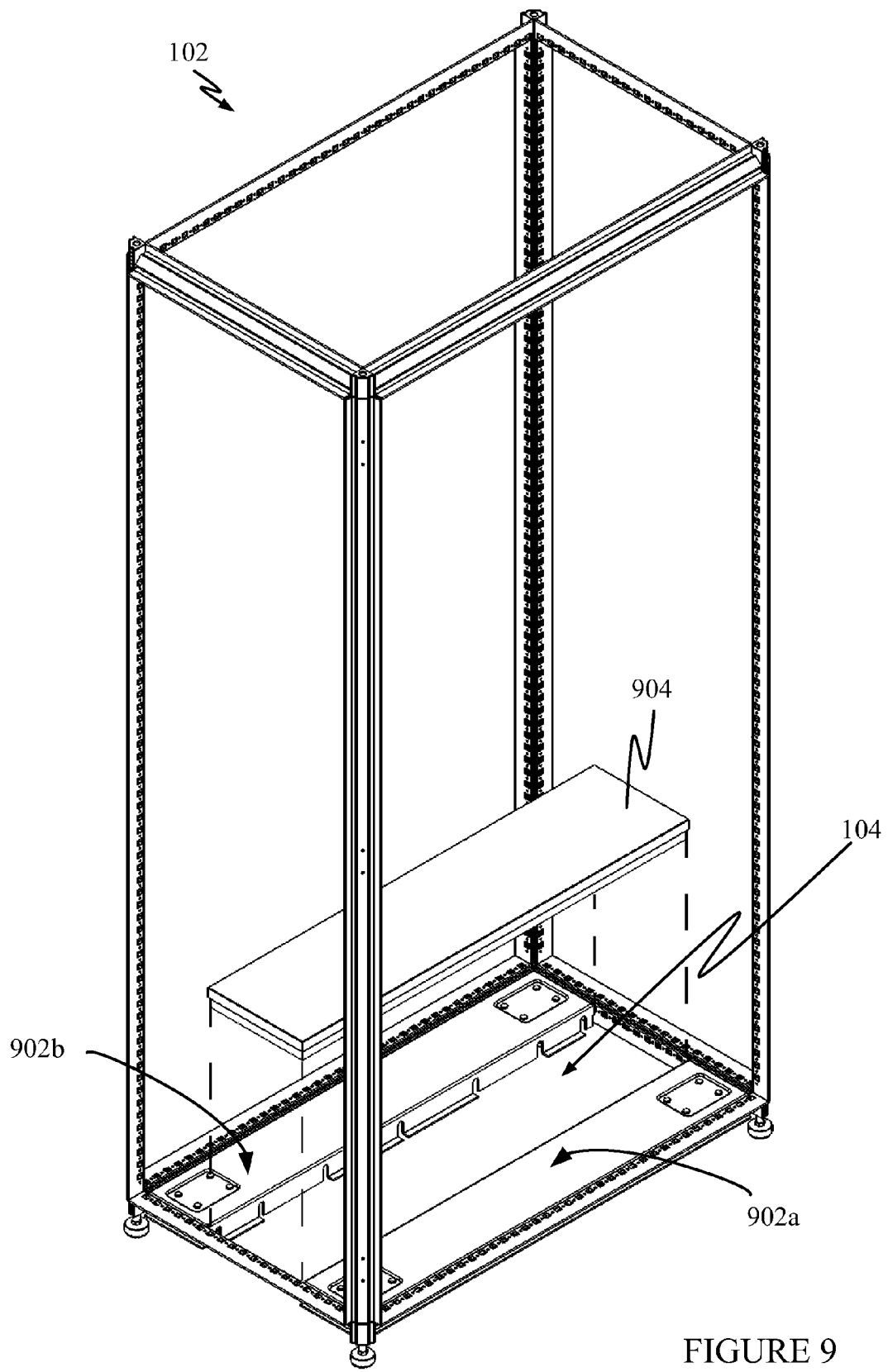
FIG. 9 illustrates how base plates may be added to the frame structure of the rack system.

FIG. 9 illustrates how base plates may be added to the frame structure 102. In this example, the base frame 104 may receive side base plates 902a and 902b along opposite sides of the rectangular base frame 104 with a center base plate 904 between the side base plates 902a and 902b.

Figure 10:
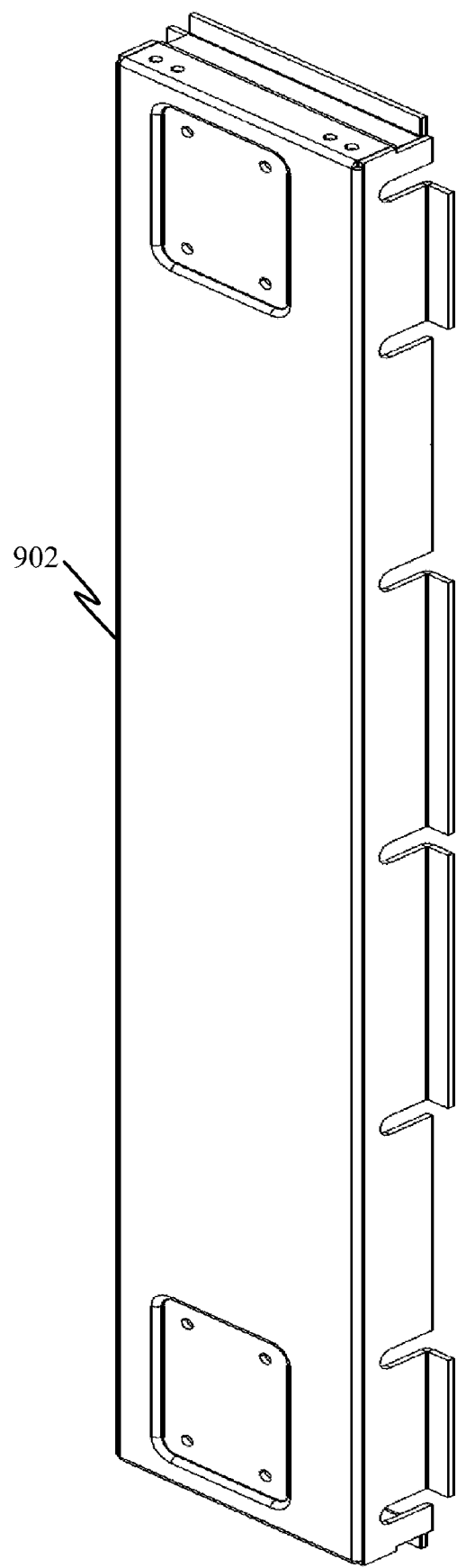
FIGS. 10 and 11 illustrate an example of a side base plate of the rack system.
Figure 11:
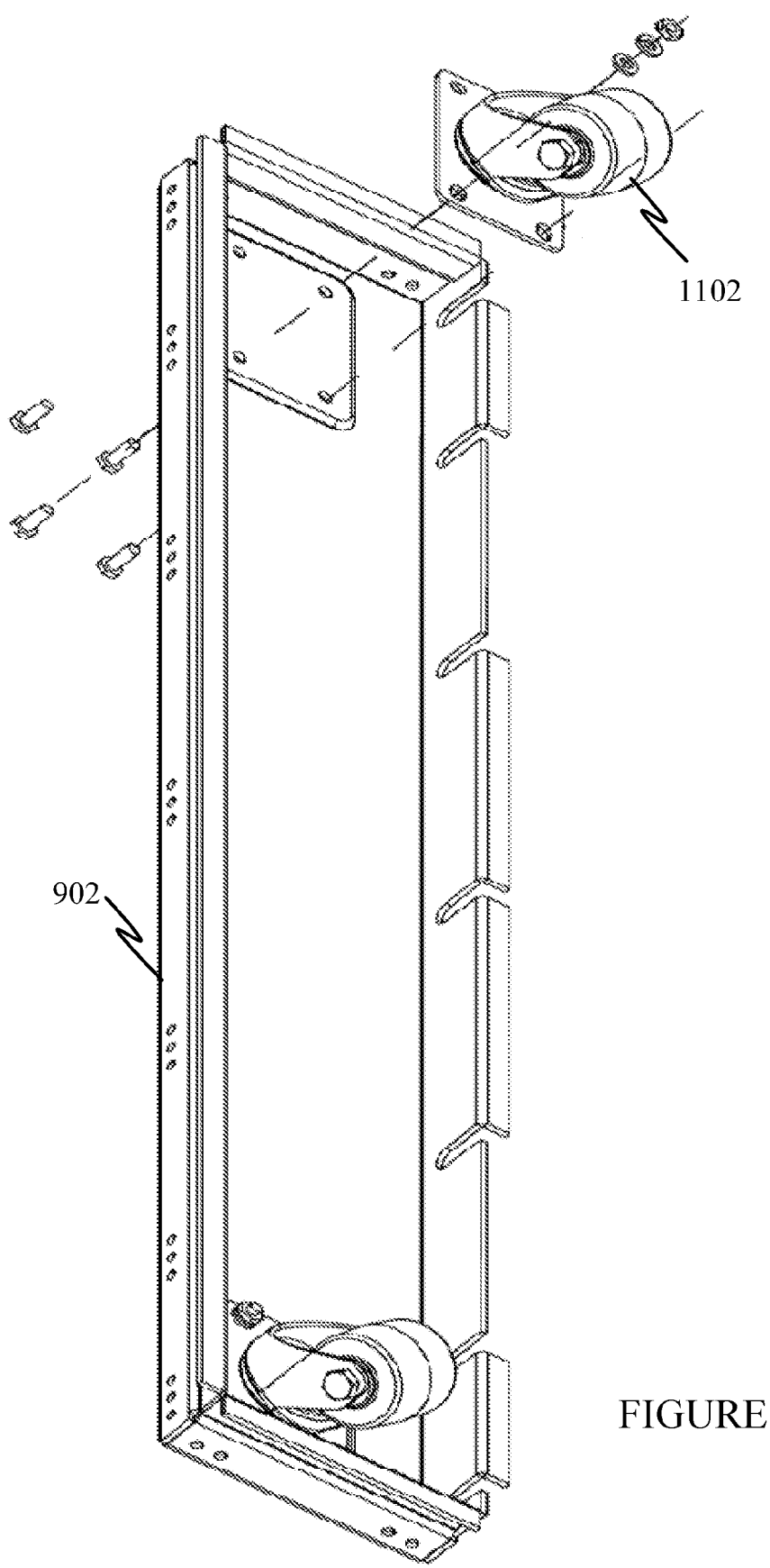

FIGS. 10 and 11 illustrate an example of a side base plate 902. The side base plate 902 may be adapted to couple to the base frame 104 and receive or attach to rollers 1102 to allow rolling the rack system.

Figure 12:
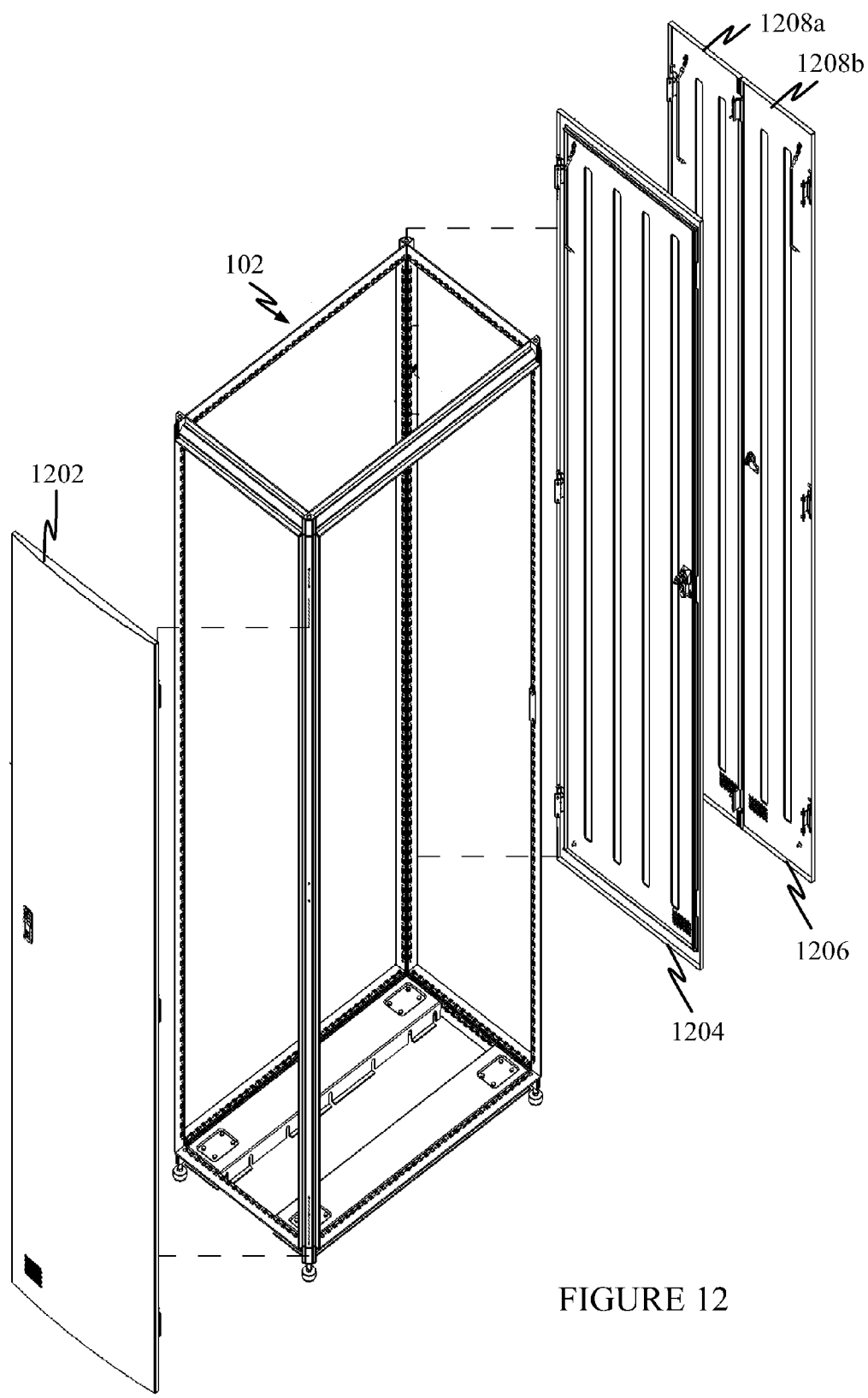
FIG. 12 illustrates how doors may be added to the frame structure of the rack system.

FIG. 12 illustrates how doors may be added to the frame structure 102 of the rack system. In this example, a first door 1202 may be coupled to a first side of the structure frame 102 and a second door 1204 may be coupled to an opposite side of the frame structure 102. Note that rather than using a single-panel door (as in doors 1202 and 1204) a double door 1206, comprising a first and second panel 1208a and 1208b may be utilized. The door may include hinges along one longitudinal side that couple to a vertical support member of the frame structure 102. The doors 1202, 1204, and 1206 may be reversible, such that they can be hung from any of the vertical support members, thereby allowing on-the-field configuration depending on the most convenient way for a door to open. For instance, the position of the hinges and the latch for the doors can be reversed so that the door may be opened from the left or from the right.

Additionally, the doors may have hinges that located outside the equipment cavity space, thus providing more space for equipment in the rack system.

Figure 13:
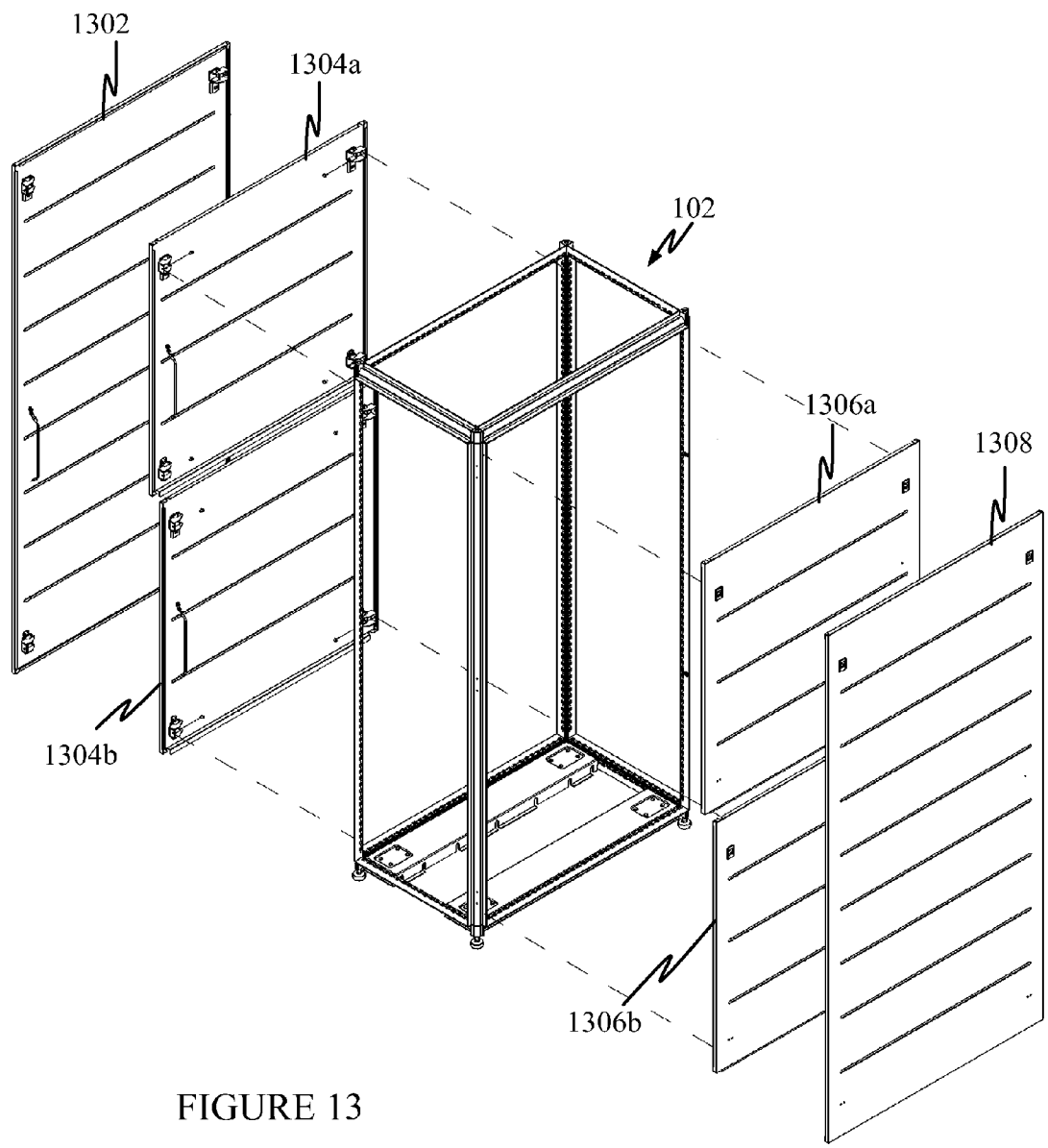
FIG. 13 illustrates how panels may be added to the frame structure of the rack system.

FIG. 13 illustrates how panels may be added to the frame structure 102 of the rack system. In this example, a first panel 1302 may be coupled to a one side of the structure frame 102 and a second panel 1308 may be coupled to an opposite side of the frame structure 102. Note that rather than using single panels (as in panels 1302 and 1308), double panels 1304a, 1304b, 1306a, and/or 1306b may be utilized. The panels may include openings and/or couplers that permit attaching them to horizontal and/or vertical support members of the frame structure 102.

Figure 14:
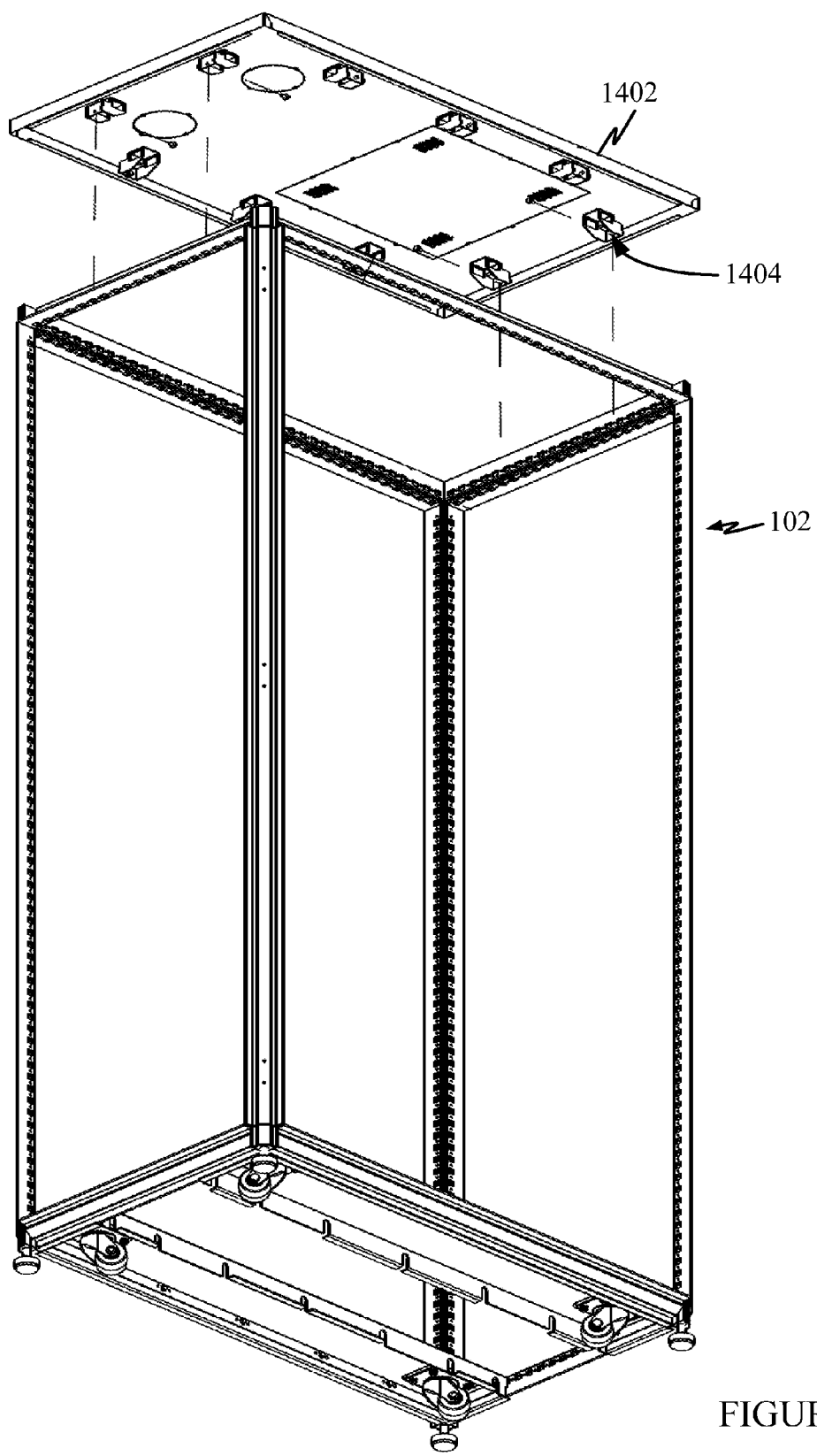
FIG. 14 illustrates how a top cover panel may be coupled to the top frame of the frame structure.

FIG. 14 illustrates how a top cover panel 1402 may be coupled to the top frame 106 of the frame structure 102. The top cover panel 1402 may include a plurality of retainers 1404 that engage one or more openings 212 (FIG. 2) of the horizontal support members of the top frame 106 to secure the top cover plate 1402 to the frame structure 102.

Figure 15:
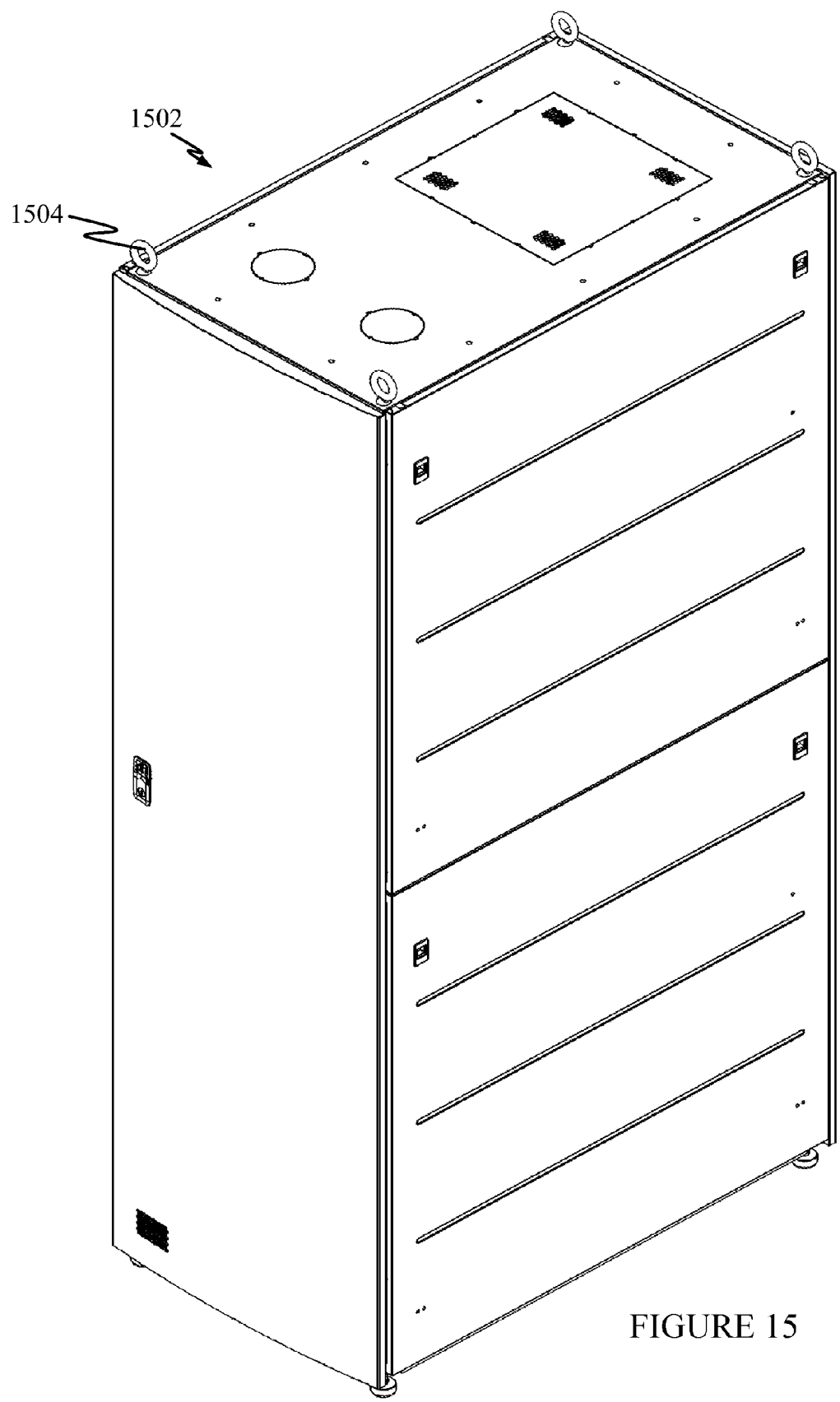
FIG. 15 illustrates an assembled rack system after exterior panels and doors have been added top the frame structure.

FIG. 15 illustrates an assembled rack system 1502 after exterior panels and doors have been added top the frame structure 102. This view illustrates how eye bolts may be attached to the top of the rack system (attached to the corner blocks attached to the frame support) that allows lifting the rack system for mounting.

Figure 16:
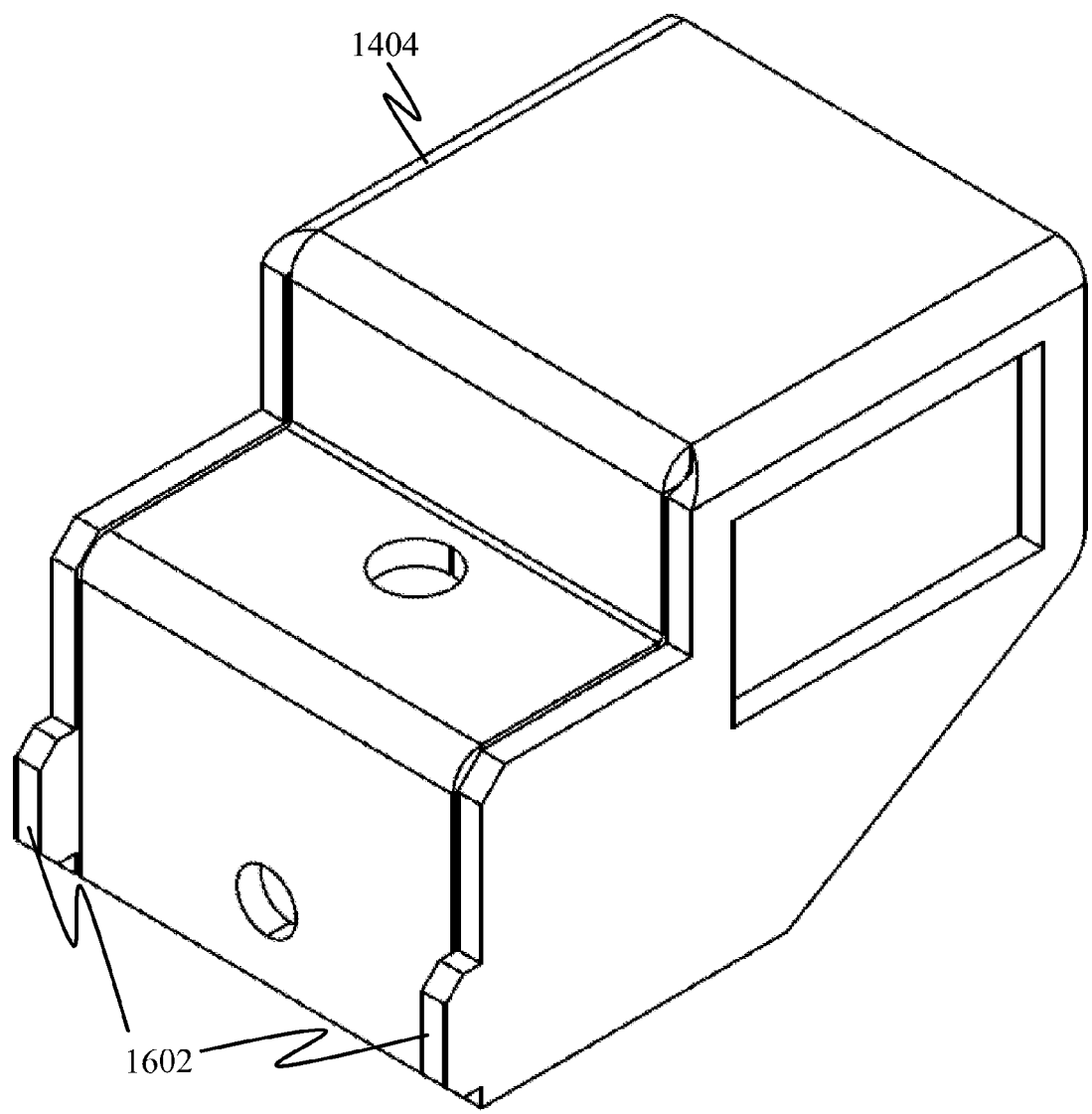
FIG. 16 illustrates an example of a retainer that may be utilized to couple panels to the frame structure.

FIG. 16 illustrates an example of a retainer 1602 that may be utilized to couple panels to the frame structure 102. The retainer may include tabs 1602 that engage the openings 212 of the frame structure 102.

Figure 17:
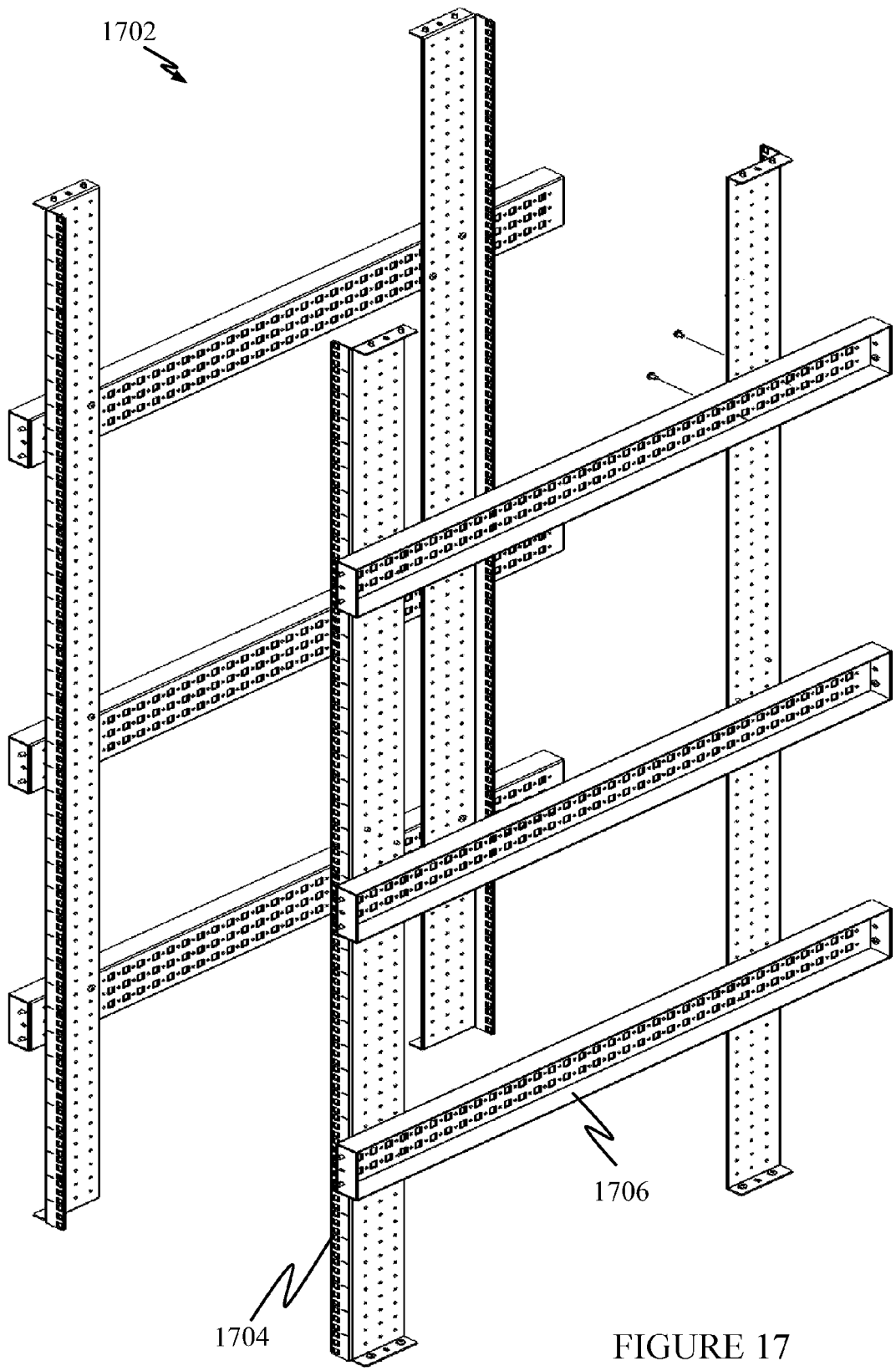
FIG. 17 illustrates an internal support frame that may be coupled to the frame support of the rack system.

FIG. 17 illustrates an internal support frame 1702 that may be coupled to the frame support of the rack system. The internal support frame 1702 may include two vertical members 1704 on each side that support a plurality of horizontal members 1706. The internal support frame may serve to couple the electronic and/or electrical equipment within the rack system.

Figure 18:
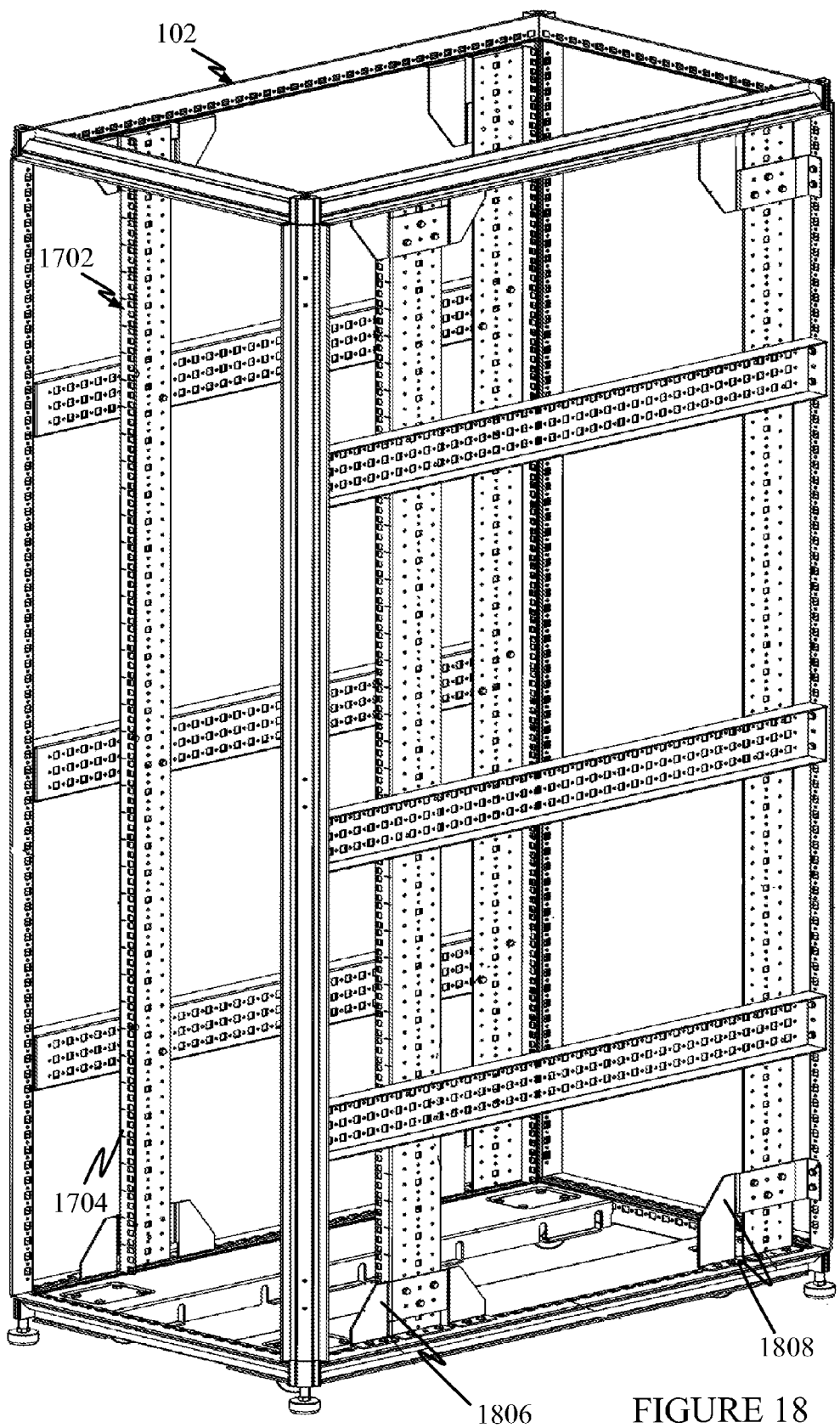
FIG. 18 illustrates how the internal support frame is mounted within the frame structure.

FIG. 18 illustrates how the internal support frame 1702 is mounted within the frame structure 102. Two different types of brackets 1806 and 1808 may be used to attach the horizontal members 1704 to the frame structure 102. Note that the horizontal members 1706 may extend between two vertical support members (e.g., vertical support members 130/132 or 128/134 of the frame structure 102) along one surface plane of the rack system to enhance the strength of the frame structure 102.

Figure 19:
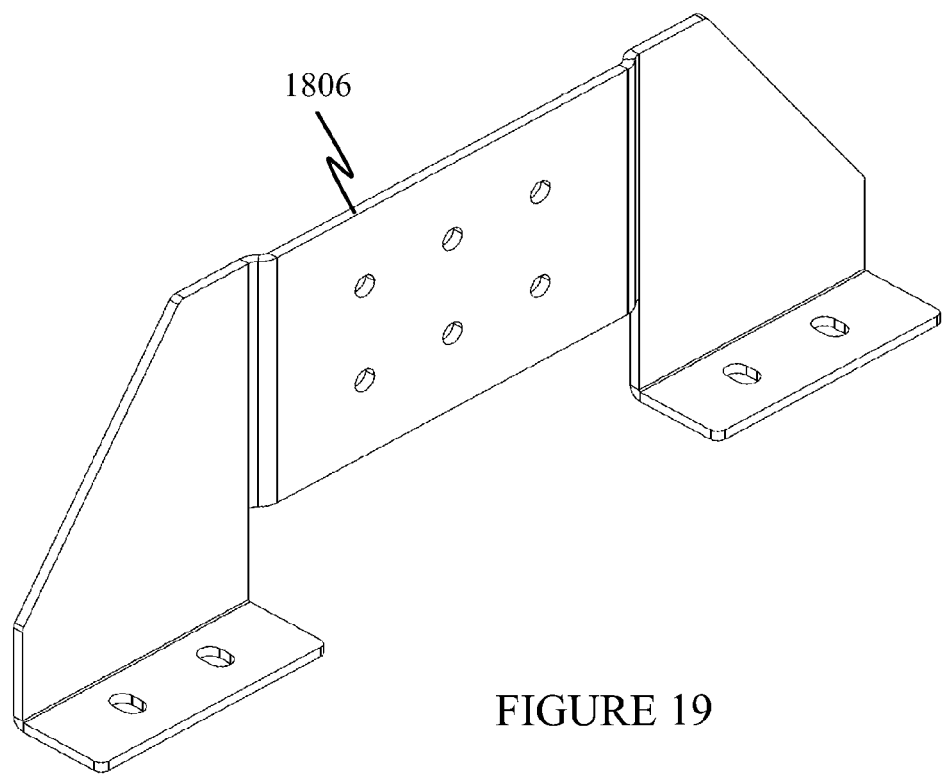
FIG. 19 illustrates a first type of bracket used to couple the internal support frame to the frame structure.

FIG. 19 illustrates a first type of bracket 1806 used to couple the internal support frame 1702 to the frame structure 102.

Figure 20:
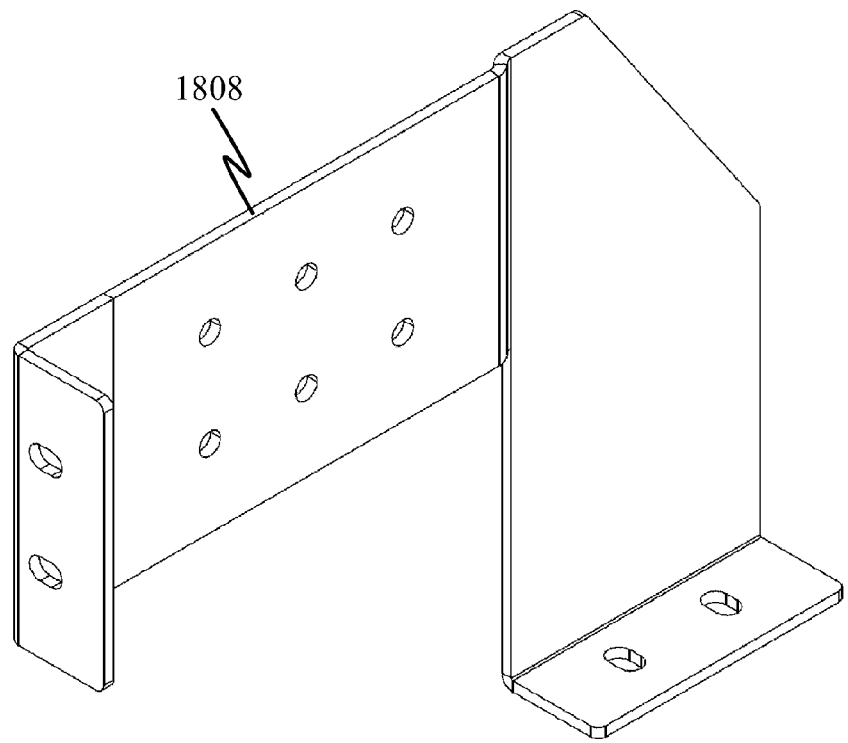
FIG. 20 illustrates a second type of bracket used to couple the internal support frame to the frame structure.

FIG. 20 illustrates a second type of bracket 1808 used to couple the internal support frame 1702 to the frame structure 102.

The doors and/or side panels may be fitted with environmental seals (e.g., for water and/or dust ingress protection) and/or electromagnetic compatibility (EMC) gaskets. In one example, EMC may be achievable if the frame structure 102 for the rack uses Aluminum-Zinc (Al—Zn) sheet metal.

One example of the rack system may be compliant with an International Protection Rating or IP Code which classifies the degrees of protection provided against instruction of solid objects, dust, accidental contact, and water in the rack system protecting electronic and/or electrical equipment. For example, the rack system may be IP55 compliant (which protected against ingress of dust as well as water jets). Additionally, the rack system by be deployed in both indoor and outdoor environments. The modularity and interchangeability of the exterior panels and doors for the racks allows different panels and/or doors to be used depending on the environment in which a rack is deployed.

Figure 21:
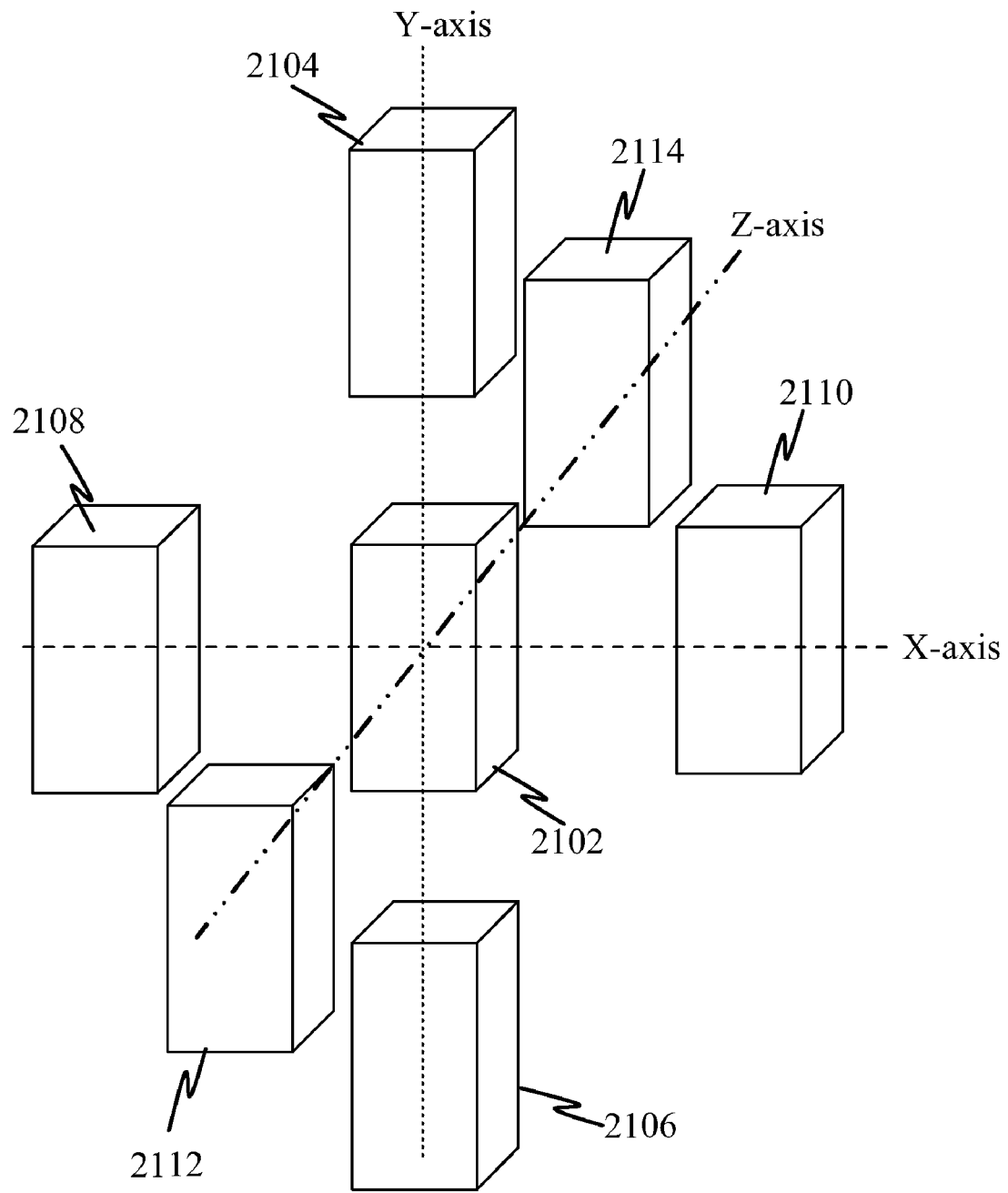
FIG. 21 illustrates an example of how a plurality of racks may be stacked together in different configurations.

FIG. 21 illustrates an example of how a plurality of racks may be stacked together in different configurations. The racks herein may include one or more of the features previously described and/or illustrated in FIGS. 1-20. A first rack 2102 may have one or more other racks 2104 and 2106 stacked on top and/or bottom along a Y-axis. This allows multiple racks to be stacked vertically. Additionally, the first rack 2102 may have one or more other racks 2108 and 2110 on either side along an X-axis. Similarly, the first rack 2102 may also have one or more other racks 2112 and 2114 on either side along a Z-axis. Consequently, racks may be added around all six sides of the first rack 2102. Note that the racks may be coupled together by fasteners (e.g., screws, interlocking mechanisms, etc.) for safety and for securing the racks to each other. The doors and/or panels of any of these racks may be replaceable with panels and/or doors, respectively, to accommodate access to each rack regardless of how the racks are configured.

Figure 22:
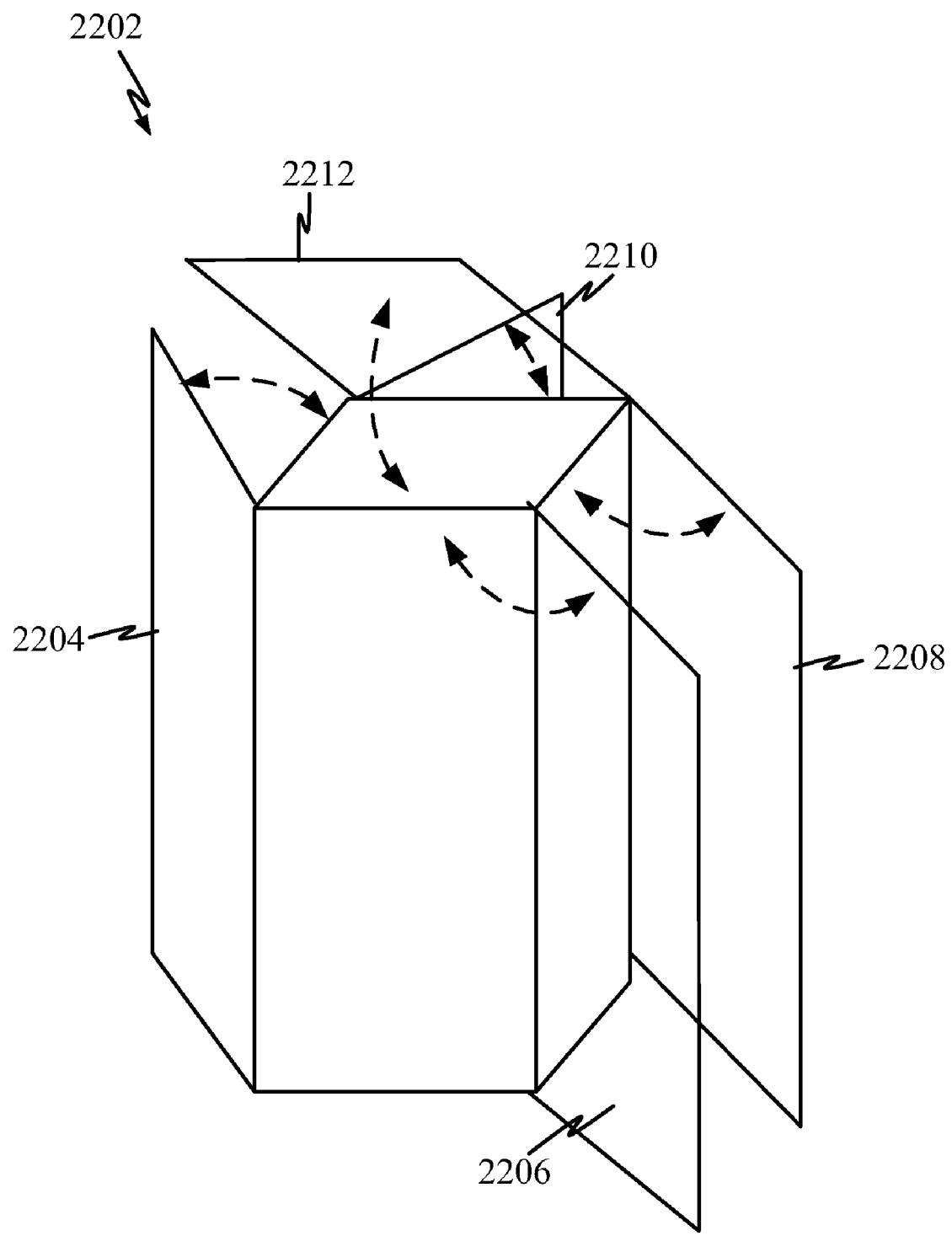
FIG. 22 illustrates an example of a rack having up to five doors.

FIG. 22 illustrates an example of a rack having up to five doors. Due to frame structure being used for the rack 2202, the external doors and/or panels are interchangeable. This allows the rack 2202 to have doors in up to five sides. That is four doors 2204, 2206, 2208 and 2210 may be hinged to four sides of the rack 2202 and a fifth door 2212 may be hinged to the top side of the rack 2202.

While certain exemplary embodiments have been described and shown in the accompanying drawings, it is to be understood that such embodiments are merely illustrative of and not restrictive on the broad invention, and that this invention is not be limited to the specific constructions and arrangements shown and described, since various other modifications may occur to those ordinarily skilled in the art.

It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A rack system for housing electronic and/or electrical equipment, comprising:
   a rectangular base frame having four horizontal support members each extending along a longitudinal axis;
   a rectangular top frame having four horizontal support members each extending along a longitudinal axis; and
   four elongated vertical support members each extending along a longitudinal axis between and joined to two associated corners of the rectangular base frame and the rectangular top frame,
   wherein the horizontal support members of the rectangular base frame and the rectangular top frame and the vertical support members have a same substantially A-frame cross-section and each support member is made from an elongated sheet material extending along a longitudinal axis by bending the sheet material about an axis parallel to a longitudinal axis of the sheet material to form at least three elongated sections including a first section and a second section and a third section extending between approximately mid-point of the first section and approximately mid-point of the second section and defined by a center segment on a first plane and two co-planar adjacent segments on a second plane, where the first and second planes are parallel planes; wherein the center segment is connected to the co-planar adjacent segments by two perpendicular segments.

2. The rack system of claim 1, wherein each of the horizontal support members of the rectangular base frame and the rectangular top frame and the vertical support members includes a plurality of openings extending longitudinally along each support member.

3. The rack system of claim 2, wherein the plurality of openings are located longitudinally along the first section and the second section of each support member.

4. The rack system of claim 2, wherein the plurality of openings serve as attachment points for exterior panel mounted to the rack system.

5. The rack system of claim 1, wherein the third section is defined by a center segment on a first plane and two co-planar adjacent segments on a second plane, where the first and second planes are parallel planes.

6. The rack system of claim 1, further comprising:
   a plurality of corner blocks located at corners where two horizontal support members and a vertical support member meet, where the corner blocks have a cross section substantially the same as an interior shape defined by the first section, the second section, and the third section of a support member.

7. The rack system of claim 6, wherein each corner block is welded to two horizontal members along right-angle sides of the corner block and welded to a vertical support member on a third side.

8. The rack system of claim 6, wherein each corner block includes at least one opening extending longitudinally and adapted to receive a leveling foot or a lifting fastener for the rack system.

9. The rack system of claim 1, further comprising:
a plurality of panels mounted to surface planes of the rack system, wherein the plurality of panels include a top panel attached to the top frame, wherein the top panel includes retainers extending outwardly from a first edge of the top panel, and a first horizontal support member, of the four horizontal support members of the rectangular top frame, which is associated with the first edge includes a plurality of openings extending longitudinally along the first horizontal support member to engage the retainers.

10. The rack system of claim 9, wherein a second edge of the top panel opposite to the first edge includes retainers for engaging a plurality of openings extending longitudinally along a second horizontal support member, of the four horizontal support members of the rectangular top frame, which is associated with the second edge.

11. The rack system of claim 1, further comprising:
a plurality of panels mounted to surface planes of the rack system, wherein the plurality of panels including retainers having tabs extending outwardly from edges of the panels, and the vertical and horizontal support members define slots facing the tabs for receiving the tabs of the panels.

12. The rack system of claim 1, further comprising:
one or more doors mounted to surface planes of the rack system, each door including at least one hinge on a first edge and a locking mechanism on an opposite second edge, where the doors are reversible so that the doors can be mounted in either a right-handed or left-handed orientation by attaching the at least one hinge to one of the vertical support members.

13. The rack system of claim 1, further comprising:
a plurality of doors hingedly coupled on up to five sides of the rack system.

14. The rack system of claim 13, wherein the plurality of doors include electromagnetic compatibility (EMC) gaskets and all support members made from aluminum-zinc (Al—Zn) sheet metal.

15. The rack system of claim 1, further comprising:
a plurality of wheel supports coupled to corners of the rectangular base frame.

16. The rack system of claim 1, further comprising:
a plurality of internal horizontal members extending between two vertical support members along one surface plane of the rack system to enhance strength of the rack system.

17. The rack system of claim 1, wherein the rack system is adapted to couple to one or more other rack systems on up to all six sides of the rack system.

18. A rack system for housing electronic and/or electrical equipment, comprising:
a rectangular base frame having four horizontal support members each extending along a longitudinal axis;
a rectangular top frame having four horizontal support members each extending along a longitudinal axis; and
four elongated vertical support members each extending along a longitudinal axis between and joined to two associated corners of the rectangular base frame and the rectangular top frame,
wherein the horizontal support members of the rectangular base frame and the rectangular top frame and the vertical support members have a same cross-section defined by a first section and a second section adjacent and substantially perpendicular to each other and a third section extending between approximately a mid-point of the first section and approximately a mid-point of the second section, where the third section is defined by a center segment on a first plane and two co-planar adjacent segments on a second plane, where the first and second planes are parallel planes; wherein the center segment is connected to the co-planar adjacent segments by two perpendicular segments.

19. The rack system of claim 18, wherein the first, second, and third sections of each support member is made from an elongated sheet material extending along a longitudinal axis by bending the sheet material about an axis parallel to the longitudinal axis of the sheet material to form at least three elongated sections defining the first, second, and third sections.

20. The rack system of claim 18, wherein each of the horizontal support members of the rectangular base frame and the rectangular top frame and the vertical support members include a plurality of openings extending longitudinally along the first section and second section of each support member.

21. The rack system of claim 18, further comprising:
a corner block located at corners where two horizontal support members and a vertical support member meet, where the corner block has a cross section substantially the same as an interior shape defined by the first section, the second section, and the third section of a support member.

22. A method for manufacturing a rack system for housing electronic and/or electrical equipment, comprising:
forming a rectangular base frame having four horizontal support members each extending along a longitudinal axis;
forming a rectangular top frame having four horizontal support members each extending along a longitudinal axis; and
coupling four elongated vertical support members between the rectangular base frame and the rectangular top frame, each elongated vertical support member extending along a longitudinal axis between and joined to two associated corners of the rectangular base frame and the rectangular top frame,
wherein the horizontal support members of the rectangular base frame and the rectangular top frame and the vertical support members have a same cross-section defined by a first section and a second section adjacent and substantially perpendicular to each other and a third section extending between approximately a mid-point of the first section and approximately a mid-point of the second section, where the third section is defined by a center segment on a first plane and two co-planar adjacent segments on a second plane, where the first and second planes are parallel planes; wherein the center segment is connected to the co-planar adjacent segments by two perpendicular segments.

23. A rack system for housing electronic and/or electrical equipment, comprising:

means for forming a base frame having horizontal support members;

means for forming a top frame having horizontal support members; and means for coupling four elongated vertical support members between the base frame and the top frame, each elongated vertical support member extending along a longitudinal axis between and joined to the base frame and the top frame, wherein the horizontal support members of the base frame and the top frame and the vertical support members have a same cross-section defined by a substantially A-frame cross-section and;

wherein the A-frame cross-section is defined by a first section and a second section adjacent and substantially perpendicular to each other and a third section extending between approximately a mid-point of the first section and approximately a mid-point of the second section, where the third section is defined by a center segment on a first plane and two co-planar adjacent segments on a second plane, where the first and second planes are parallel planes; wherein the center segment is connected to the co-planar adjacent segments by two perpendicular segments.

* * * * *